(12) United States Patent
Peake et al.

(10) Patent No.: US 7,122,860 B2
(45) Date of Patent: Oct. 17, 2006

(54) TRENCH-GATE SEMICONDUCTOR DEVICES

(75) Inventors: Steven T. Peake, Warrington (GB);
Philip Rutter, Stockport (GB);
Raymond J. Grover, Manchester (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 48 days.

(21) Appl. No.: 10/515,748

(22) PCT Filed: May 21, 2003

(86) PCT No.: PCT/IB03/02233

§ 371 (c)(1),
(2), (4) Date: Nov. 24, 2004

(87) PCT Pub. No.: WO03/103056

PCT Pub. Date: Dec. 11, 2003

(65) Prior Publication Data

US 2005/0173758 A1    Aug. 11, 2005

(30) Foreign Application Priority Data

May 31, 2002  (GB) .............................. 0212564.9
Dec. 11, 2002 (GB) .............................. 0228809.0

(51) Int. Cl.
*H01L 29/78* (2006.01)
(52) U.S. Cl. ................. 257/339; 257/330; 257/332; 257/334
(58) Field of Classification Search ............... 257/330, 257/332, 334, 339
See application file for complete search history.

(56) References Cited

U.S. PATENT DOCUMENTS

| 5,998,833 | A | * | 12/1999 | Baliga .................. 257/329 |
| 6,175,225 | B1 | | 1/2001 | De Groot |
| 6,927,101 | B1 | * | 8/2005 | Henninger et al. ......... 438/135 |
| 2003/0178676 | A1 | * | 9/2003 | Henninger et al. ......... 257/340 |
| 2005/0208722 | A1 | * | 9/2005 | Peake et al. ................ 438/259 |

FOREIGN PATENT DOCUMENTS

| DE | 102 12 149 | * | 10/2003 |
| DE | 102 12 149 A1 | | 10/2003 |
| EP | 1 170 803 A2 | | 1/2002 |
| GB | 1 170 803 A2 | * | 9/2002 |
| WO | WO 02 13257 | * | 2/2002 |
| WO | WO 02/13257 A2 | | 2/2002 |

* cited by examiner

*Primary Examiner*—Mary Wilczewski
*Assistant Examiner*—Seth Barnes
(74) *Attorney, Agent, or Firm*—Aaron Waxler; Paul Im

(57) ABSTRACT

A trench-gate semiconductor device, for example a MOSFET or IGBT, includes a semiconductor body (20) having a drain region (4) comprising a drain drift region (4a) and a drain contact region (4b). An insulated field plate (24) is included in the trench (10) between the gate (8) and the drain contact region (4b), wherein the field plate (24) is for connection to a bias potential greater than the gate potential and near to the bulk breakdown voltage of the drain drift region (4a). The field plate (24) causes the potential drop across the drain drift region (4a) to be spread considerably more evenly, particularly at applied voltages greater than the bulk breakdown voltage, thereby substantially increasing the breakdown voltage of the device.

11 Claims, 6 Drawing Sheets

TRENCH-GATE SEMICONDUCTOR DEVICES

The present invention relates to trench-gate semiconductor devices, for example insulated-gate field effect power transistors (commonly termed "MOSFETs"), or insulated-gate bipolar transistors (commonly termed "IGBTs").

Such trench-gate semiconductor devices are known having a source region and a drain region of a first conductivity type which are separated by a channel-accommodating region adjacent to the gate. U.S. Pat. No. 5,998,833 describes a vertical device of this type which includes a trench-based source electrode, between the gate electrode and the bottom of the trench. The trench-based source electrode is electrically connected to the source electrode of the device. It is provided with a view to improving the breakdown and high frequency switching characteristics of the device with minimal impact on its specific on-state resistance.

EP-A-1170803 discloses a similar structure to that referred to above in relation to U.S. Pat. No. 5,998,833. A "shield gate" is located below the gate electrode, near the bottom of the trench. In particular, it describes a device in which the shield gate is connected to the source region. The contents of U.S. Pat. No. 5,998,833 and EP-A-1170803 are hereby incorporated herein as reference material.

It is an object of the present invention to provide a trench-gate semiconductor device with improved performance, and more particularly having improved breakdown properties.

The present invention provides a trench-gate semiconductor device including:

a semiconductor body defining a trench having an insulated gate therein, the semiconductor body comprising a source region and a drain region of a first conductivity type which are separated by a channel-accommodating region adjacent to the gate, the drain region comprising a drain drift region and a drain contact region, with the drain drift region between the channel-accommodating region and the drain contact region, and the drain drift region doped to a lesser extent than the drain contact region; and an insulated field plate in the trench between the gate and the drain contact region, wherein the field plate is for connection to a bias potential greater than the gate potential and near to the bulk breakdown voltage of the drain drift region.

It will be appreciated by those skilled in the art that the term "bulk breakdown voltage" is used herein to refer to the maximum voltage per micron which may be withstood without avalanche breakdown by a one-sided abrupt 1D p-n junction formed using semiconductor material of a given doping level at room temperature.

The inventors have realised that connection of such an insulated field plate to a potential close to the bulk breakdown voltage of the drain drift region causes the potential drop across the drain drift region to be spread considerably more evenly particularly at applied voltages greater than the bulk breakdown voltage, thereby substantially increasing the breakdown voltage of the device. This enables a higher level of doping to be used in the drain drift region relative to a device without the field plate having the same breakdown characteristics, thereby providing devices with a lower specific on-state resistance.

Furthermore, the presence of the field plate reduces the gate-to-drain capacitance of the device. It therefore improves its switching speed and reduces the amount of power loss occurring during switching by reducing the amount of charge which flows to and from the gate. This is particularly beneficial in applications requiring high frequency switching.

Preferably, the trench and/or the field plate extend substantially to the junction between the drain drift region and the drain contact region, to optimise its ability to even out the electric field across the drain drift region. In preferred embodiments, the trench and/or field plate extend up to the transition region between the drain drift and contact regions. If the trench and/or field plate extend into this transition region or beyond then field crowding at the corners of the trench may be increased.

The device of the invention may be a vertical device, with the field plate located in the trench between the gate and the bottom of the trench. Alternatively, it may be a lateral device, the field plate being provided between the gate and a side wall of the trench.

The present invention also provides a module comprising a device having the configuration defined above along with one or more other semiconductor devices, wherein the field plate is conveniently connected to an internal voltage line of the module. Alternatively, an additional external terminal may be provided on the device (in the case of a discrete device) or the module which is electrically connected to the field plate. This enables a dedicated voltage level for the field plate to be applied.

The inventors have found that application of a bias potential to the field plate around 60 to 100% of the bulk breakdown voltage of the drain drift region is preferable. More particularly, a bias potential of around 80% of the bulk breakdown voltage of the drain drift region is preferred, as it allows some tolerance of variations in the width of the transition region between the drain drift and contact regions which may lead to variations in the level of doping in the drain drift region around the bottom of the trench.

According to a further aspect, the present invention provides a method of operating a trench-gate semiconductor device having a field plate in the trench as described herein, the method comprising connecting the field plate of the device to a bias potential greater than the gate potential and near to the bulk breakdown voltage of the drain drift region.

Embodiments of the invention will now be described by way of example and with reference to the accompanying schematic drawings, wherein.

Figure 1:
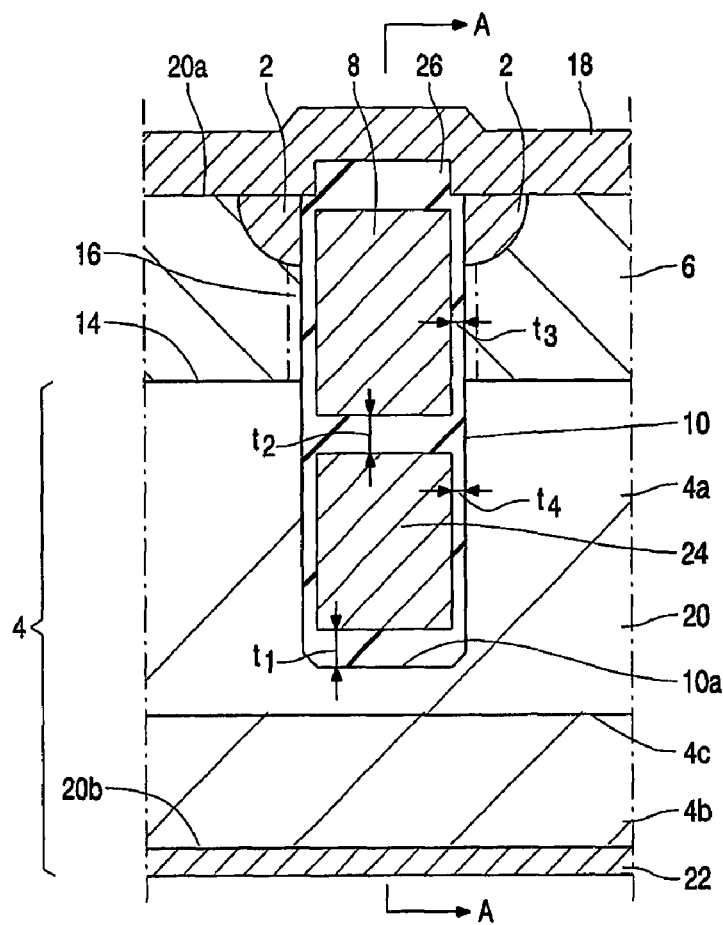
FIG. 1 is a cross-sectional view of a transistor cell area of a semiconductor body embodying the present invention.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

FIG. 1 illustrates an exemplary embodiment of a power semiconductor device in accordance with the invention. Source and drain regions 2 and 4, respectively of a first conductivity type (n-type in this example) are separated by a channel-accommodating region 6 of the opposite, second conductivity type (that is, p-type in this example).

By way of example, FIG. 1 shows a vertical device structure in which region 4a may be a drain drift region formed by an epitaxial layer of high resistivity (low doping) on a substrate, drain contact region 4b of relatively high conductivity. The drain drift and contact regions 4a and 4b form a junction 4c therebetween. The drain contact region 4b may be of the same conductivity type (n-type in this example) as the region 4a to provide a vertical MOSFET, or it may be of opposite conductivity type (p-type in this example) to provide a vertical IGBT.

A gate 8 is present in a trench 10 which extends through the regions 2 and 6 and into an underlying portion of the drain drift region 4a. The application of a voltage signal to the gate 8 in the on-state of the device serves in known manner to induce a conduction channel 16 in the region 6 and to control current flow in this conduction channel 16 between the source and drain regions 2 and 4.

The source region 2 is contacted by a source electrode 18 in the case of a MOSFET at the top major surface 20a of the device semiconductor body 20 (typically of monocrystalline silicon). The drain contact region 4b is contacted by an electrode 22, called the drain electrode in the case of a MOSFET, at the bottom major surface 20b of the device semiconductor body 20. The source and drain electrodes 18 and 22 are known as the emitter and collector, respectively, in an IGBT.

A field plate 24 is provided in the trench 10, between the gate 8 and the bottom 10a of the trench. The field plate is preferably formed of doped polycrystalline silicon of the first conductivity type. Alternatively, it may be made of metal, for example. Both the field plate 24 and the gate 8 are insulated from each other and from the source electrode 18 and surrounding semiconductor body 20 by insulating material 26. This layer may consist of silicon dioxide, for example.

In the embodiment shown in FIG. 1, the trench 10 and field plate 24 extend into the semiconductor body 20 to a depth close to the junction 4c between the drain drift and contact regions, 4a and 4b. As is well known in the art, in practice, there is a doping transition region between regions 4a and 4b, as there is dominant diffusion of dopant atoms from the more highly doped drain contact region into the drain drift region. Typically, this out-diffusion extends 1 to 1.5 microns above the junction 4c. Preferably, the trench 10 extends to a depth immediately above the transition region.

The field plate 24 is spaced from the bottom of the trench by a layer of insulating material 26 of thickness t1. Similarly, it is spaced from the gate by a layer of insulating material 26 of thickness t2. The side walls of the gate and field plate are insulated from the semiconductor body by layers of insulating material 26 of thickness t3 and t4, respectively. Thicknesses t3 and t4 may be of the order of 38 nm, whilst t1 may be of the order of 0.2 micron, for example. A relatively thick layer is desirable below the field plate (ie. t1), particularly for higher levels of doping in the drain drift region 4a, so that it is able to withstand the high electric fields produced at the corners of the trench. Thickness t2 is preferably greater than t3 and t4. In use, (as will be described in more detail below) a bias potential near to the bulk breakdown voltage of the drain drift region 4a is applied to the field plate 24. Therefore it is advantageous to have a relatively thick insulating layer (of the order of 0.2 micron, for example) between the field plate and the gate to withstand the potential difference therebetween.

Low doped drain drift region 4a may typically be grown as an epitaxial layer of the first conductivity type. The doping concentration of the drift region may be substantially uniform throughout its depth. Nevertheless, it may be preferable to vary the concentration across the drift region. In particular, providing a doping profile with the concentration decreasing (for example in a linear manner) in the direction from the drain contact region 4b towards the channel-accommodating region 6 may reduce the on-resistance of the device.

Figure 2:
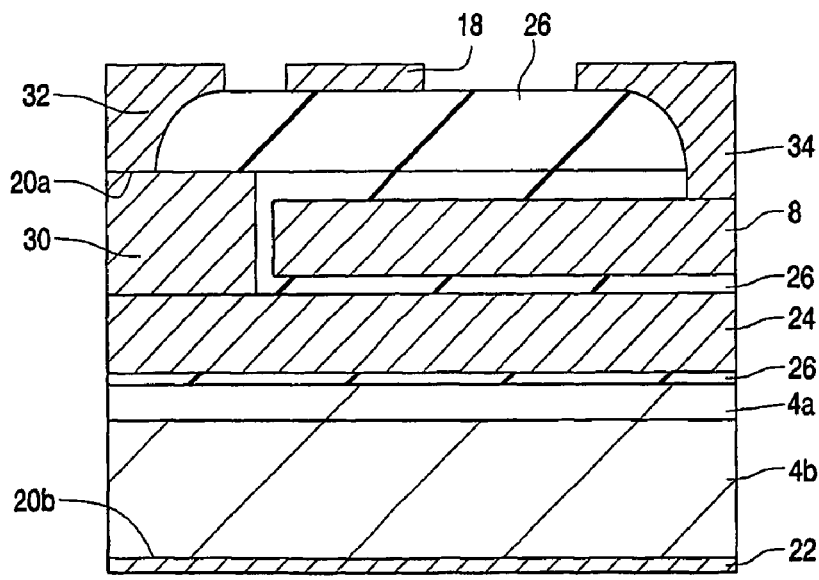
FIG. 2 is a cross-sectional view of the semiconductor body of FIG. 1 along line A—A indicated in FIG. 1.

FIG. 2 shows a cross-section through the device of FIG. 1, along line A—A. It illustrates an example of how a connection to the field plate 24 may be made from outside the semiconductor body 20, independently of the gate and source electrode.

Doped polycrystalline silicon contact layer 30 is provided towards one end of the trench 10 and is electrically connected to the field plate 24. It extends from the field plate to the top major surface 20a of the device semiconductor body 20, where it is contacted by a field plate contact electrode 32. The gate 8 is electrically connected to a gate contact electrode 34 towards the other end of the trench 10.

The process flow described in EP-A-1170803 with reference to FIGS. 9 to 13 thereof is an example of a suitable method of manufacturing a device embodying the present invention, except for the step of patterning a metal layer to provide contact electrodes on the semiconductor body. In particular, the metal layer should be patterned to provide three separate contact electrodes shown in present FIG. 2, namely source electrode 18, field plate contact electrode 32, and gate contact electrode 34.

Figure 3:
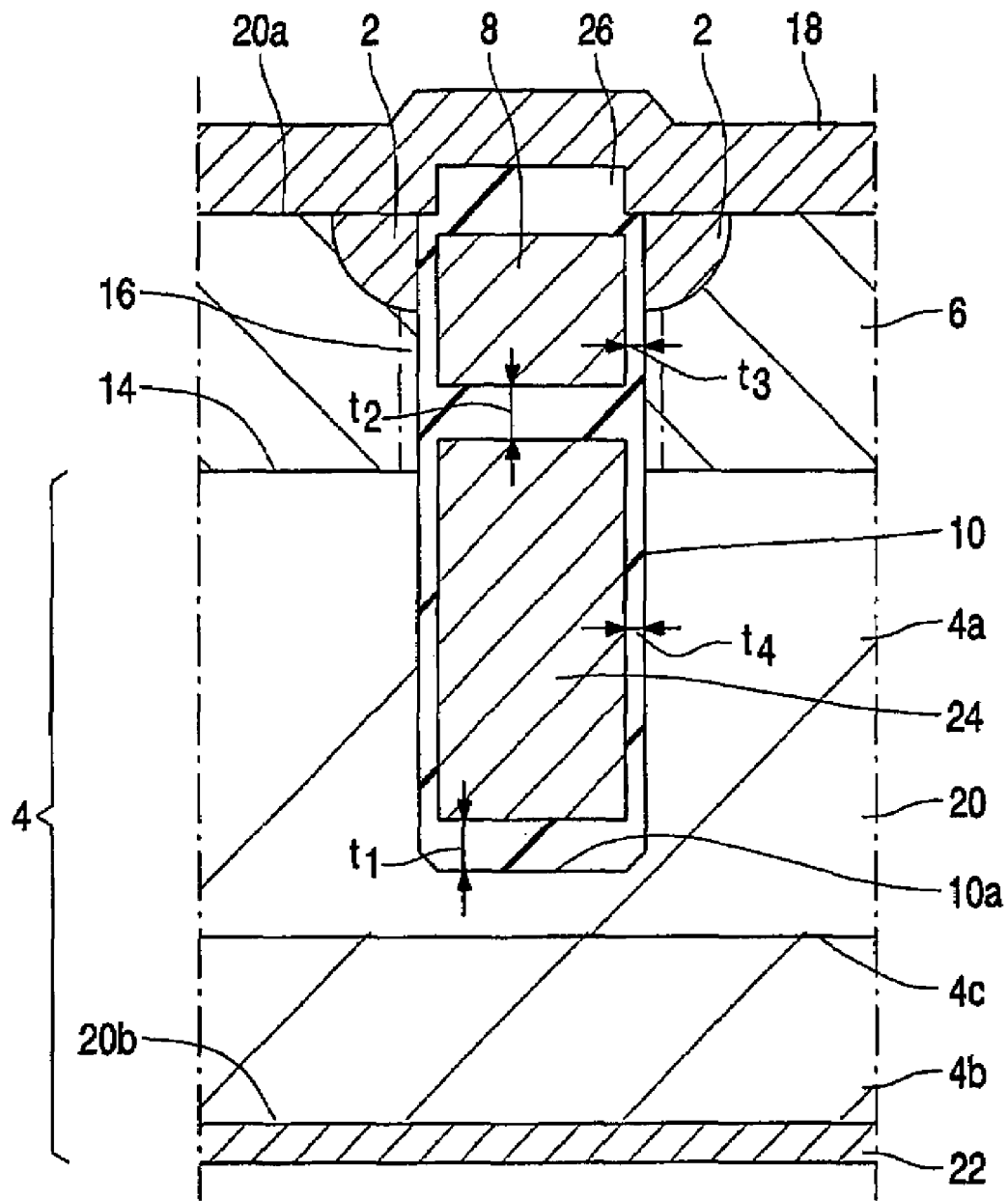
FIG. 3 is a cross-sectional view of a transistor cell area of a semiconductor body according to a further embodiment of the present invention.

FIG. 3 shows a cross-section through a further embodiment of the invention, similar to that of FIG. 1. The embodiment of FIG. 3 differs from that of FIG. 1 in that the gate 8 is shallower than the upper boundary 14 of the drain drift region 4a adjacent the trench 10 in FIG. 3, whereas in FIG. 1, the gate 8 extends below this boundary beyond the channel-accommodating region, into the drain drift region. In the device of FIG. 3, exposure of the gate electrode to the drain drift region is further reduced as it does not extend into the drain drift region, thereby lowering the gate-drain capacitance of the device still further. As illustrated in FIG. 3, the field plate 24 may extend above the drain drift region boundary 14 to enhance its shielding of the gate from the drain drift region.

In the embodiment of FIG. 3, the bias potential connected to the field plate is sufficient to induce a channel alongside the field plate, such that in the on-state, simultaneous operation of the gate 8 and biasing of the field plate causes a conduction channel 16 to be formed between the source and drain regions of the device which extends alongside both the gate and the field plate.

Figures 4A, 4B, 4C:
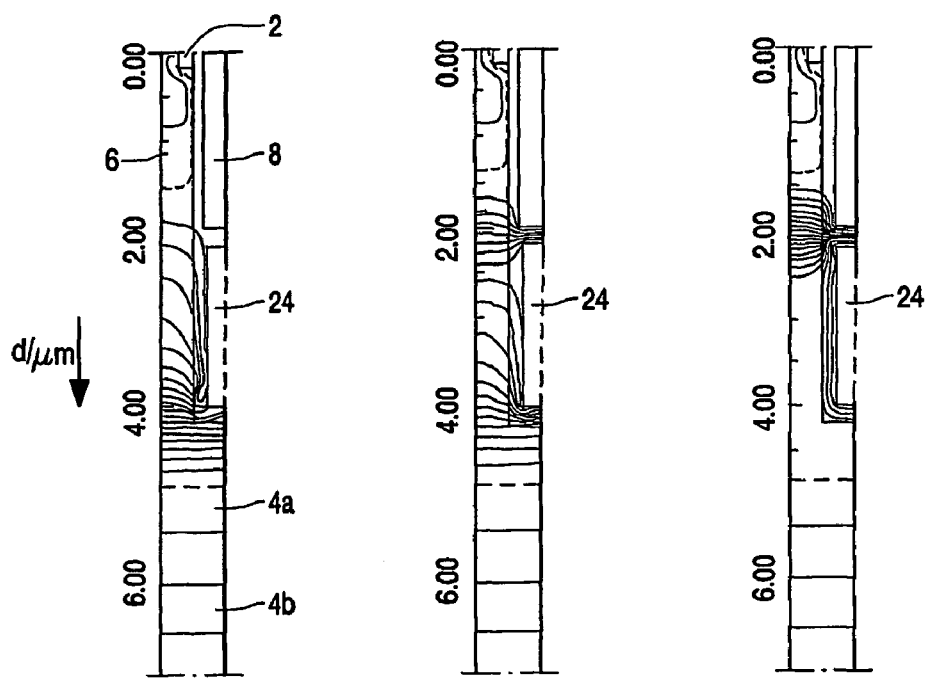
FIGS. 4A, 4B and 4C are cross-sectional views of a portion of a transistor cell area of a semiconductor body embodying the present invention, showing lines of equal potential.

FIGS. 4A to 4C are cross-sectional views of a portion of a transistor cell area of a semiconductor body embodying the present invention, which illustrate the beneficial effect that the field plate biased close to the bulk breakdown voltage of the drain drift region has on the device breakdown characteristics.

Simulated lines of equal potential are shown by solid lines. By way of example, the simulations are based on the use of silicon with a bulk breakdown voltage of around 30V. The views 4A to 4C show the potential distribution in the forward blocking mode at the onset of breakdown, with the field plate 24 held at 0, 29 and 33V respectively. The extent of the depletion region in each case is indicated by dashed lines. Along the left hand edge of each view, the distance d from the top major surface of the device semiconductor body is indicated in microns.

It can be seen by comparison of FIGS. 4A to 4C that a substantially more even distribution of potential is achieved when the field plate is at 29V (FIG. 4B), relative to the other two examples. Significant field crowding is apparent in FIGS. 4A and 4C, leading to breakdown at much lower voltages.

Figure 5:
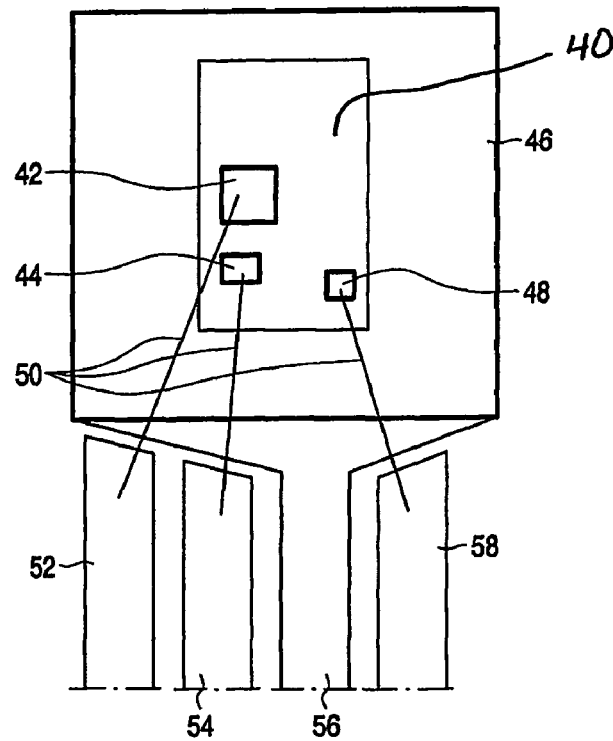
FIG. 5 is an internal plan view of the packaging of a discrete device embodying the present invention.

FIG. 5 shows an internal plan view of the packaging of a discrete device in accordance with an embodiment of the invention. A MOSFET die 40 has a gate bond pad 42 connected to its gate contact electrode, a source bond pad 48 connected to its source contact electrode, and a field plate bond pad 44 connected to its field plate contact electrode for applying an independent bias thereto. The MOSFET is mounted on a drain pad 46, which is electrically connected to the drain electrode 22 on the bottom major surface of the MOSFET die. Bond wires 50 connect the bond pads 42, 44, 48 to respective terminals or pins 52, 54 and 58. Drain pad 46 directly contacts the respective pin 56. The packaging may be completed in a known manner.

Figure 6:
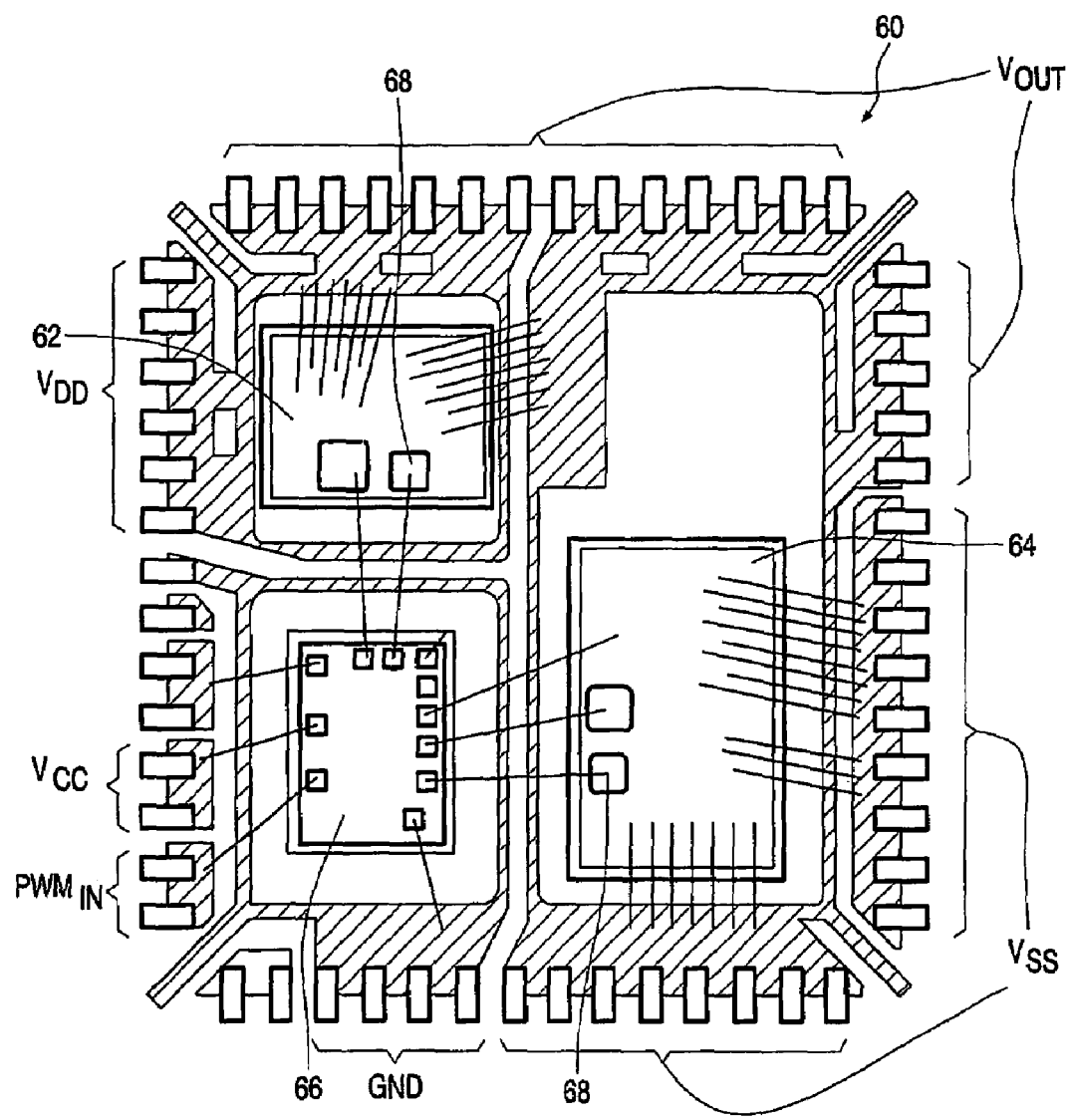
FIG. 6 is an internal plan view of the packaging of a module embodying the present invention.

In preferred embodiments of the invention, a semiconductor device as described above is included in a module, with its field plate(s) connected to an internal voltage line or level of the module. As an example of this, FIG. 6 shows an internal plan view of the packaging of a module 60 including two semiconductor devices having biased field plates of the form described above. The module is a DC-DC converter, for use as a VRM in a PC motherboard, for example. A known DC-DC converter circuit and its operation are described in U.S. Pat. No. 6,175,225 of the present applicant (our ref. PHB34370), the contents of which are hereby incorporated herein as reference material. The configuration shown in FIG. 6 is a modified implementation of the circuit shown in FIG. 3 of U.S. Pat. No. 6,175,225.

The module of FIG. 6 includes a control MOSFET 62, a "sync" MOSFET 64, and a driver IC 66. The MOSFETs correspond to first and second switches 5 and 6 of FIG. 3 of U.S. Pat. No. 6,175,225, respectively. They are connected in series between a DC input, $V_{DD}$, and ground, $V_{SS}$. The switches are closed alternately in response to a switching signal, $PWM_{IN}$, which is inputted to driver IC 66. The further operation of a circuit of this type is described in U.S. Pat. No. 6,175,225.

In accordance with the present invention, each MOSFET 62, 64 includes a field plate bond pad 68 which is connected to the respective field plate contact electrode of each MOSFET. The field plate bond pad of sync MOSFET 64 is connected to the power supply voltage, $V_{CC}$, via the driver IC, for example, which may typically be 5 or 12V. In the circuit shown in FIG. 3 of U.S. Pat. No. 6,175,225, the gate drive to the control MOSFET ("first switch 5") is via a boost or reservoir capacitor 37 connected between a boost terminal 33 and Vout. In this case, the field plate bond pad of control MOSFET 62 would be connected to boost terminal 33.

In an example where $V_{CC}$ is 12V, the silicon selected for the MOSFETs 62 and 64 may have a bulk breakdown voltage of around 15V or more, for example.

It will be appreciated that other potentials may be provided in a module for connection to the field plate bond pad of a MOSFET, for example via an external pin of the module or by including additional circuitry within the module.

Figure 7:
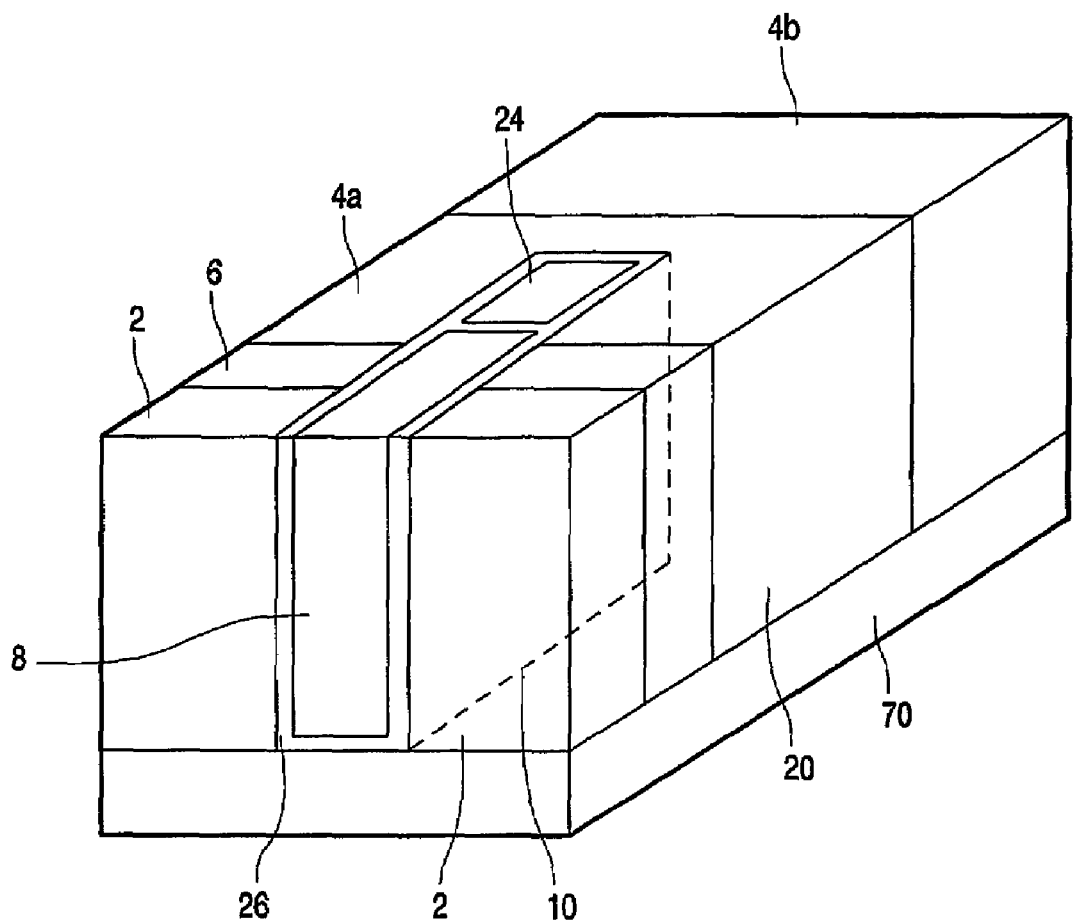
FIG. 7 is a perspective view showing the transistor cell area of a semiconductor body of a lateral device embodying the present invention.

A vertical trench-gate device has been described with reference to FIGS. 1 to 4 hereof. However, a lateral trench-gate device is also possible in accordance with the invention, and a cross-sectional perspective view of an embodiment thereof is shown in FIG. 7. Source and drain electrodes are omitted from the Figure in the interests of clarity.

In the device of FIG. 7, the field plate 24 is provided in the trench 10 between the gate 8 and the drain contact region 4b as before, but in this case, it is located alongside rather than below the gate to modulate the electric field distribution across the drain drift region 4a of the device. The device is fabricated on a substrate 70, highly doped with the opposite, second conductivity type dopant (that is, p-type in the examples described herein).

Although the gate 8 is shown in FIG. 7 as extending into the drain drift region 4a, in another preferred embodiment, the gate does not extend beyond the channel-accommodating region 6, in a similar manner to the embodiment of FIG. 3. Instead the gate is laterally spaced from the boundary of the drain drift region. As in the FIG. 3 embodiment, this serves to reduce further the gate-to-drain capacitance of the device.

It will be evident that many variations and modifications are possible within the scope of the invention. The particular examples described above are n-channel devices, in which the source and drain regions 2 and 4 are of n-type conductivity, the channel-accommodating body region 6 is of p-type conductivity, and an electron inversion channel 16 is induced in the region 6 by the gate 8. By using opposite conductivity type dopants, a p-channel device can be made. In that case, regions 2 and 4 are of p-type, the region 6 and substrate 70 are of n-type, and a hole inversion channel is induced in the region 6 by the gate 8.

Furthermore, an accumulation-mode device may be manufactured in accordance with the invention. Such a device of the p-channel type has p-type source and drain regions 2 and 4, and a p-type channel-accommodating region 6. It may also have an n-type deep localised region within each cell. N-type polycrystalline silicon may be used for the gate 8. In operation, a hole accumulation channel 16 is induced in the region 6 by the gate 8 in the on-state. The low-doped p-type region 6 may be wholly depleted in the off-state, by depletion layers from the insulated gate 8 and from the deep n-type region.

In the embodiments depicted in FIGS. 1, 3 and 7, the trench 10 extends in the semiconductor body close to the junction between the drain drift region 4a and the drain contact region 4b. It will be appreciated that the extent of the trench towards the drain contact region may be reduced whilst still providing benefits in terms of the improved breakdown properties of the device, and reduced gate-to-drain capacitance.

Figure 8:
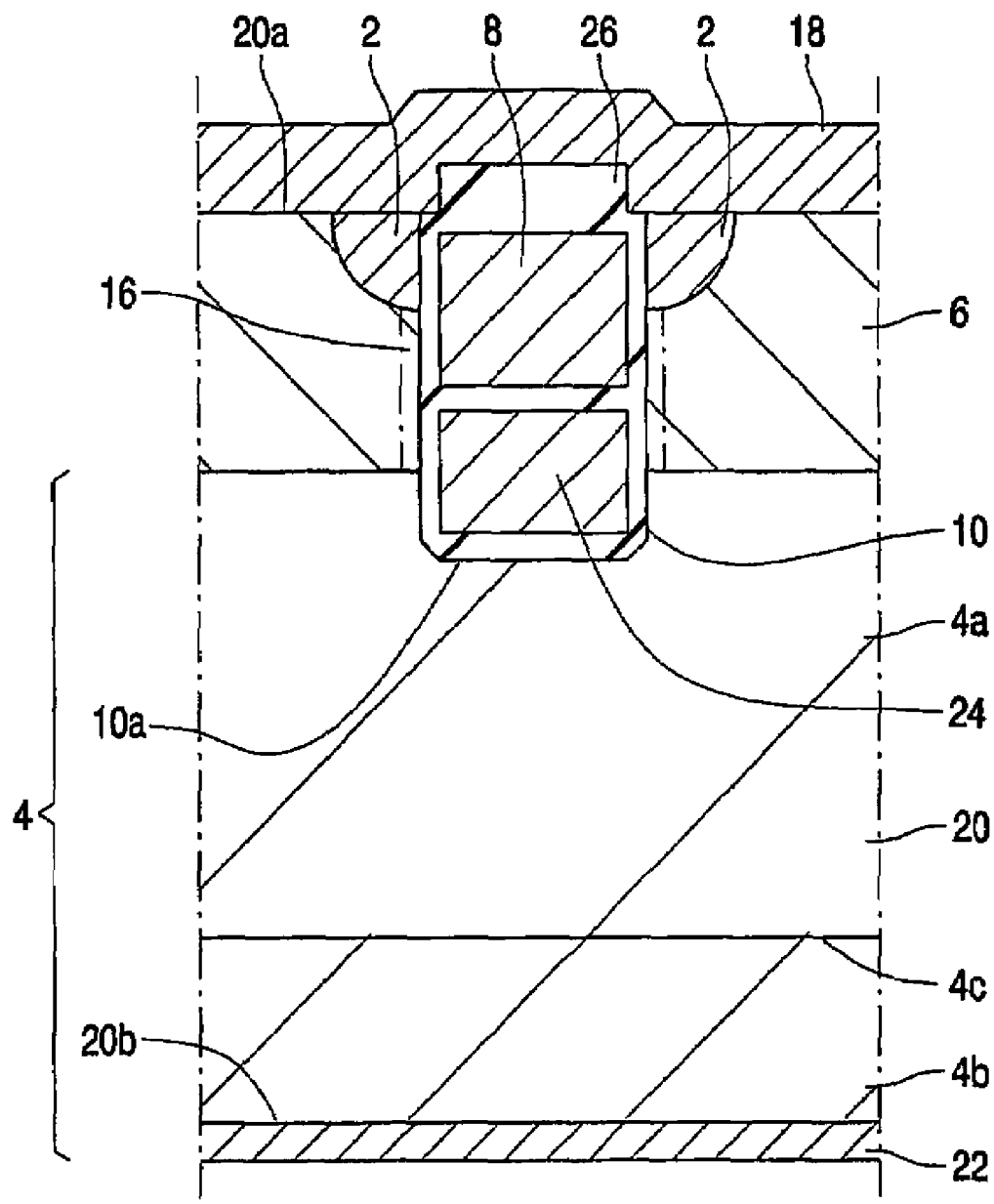
FIG. 8 is a cross-sectional view of a transistor cell area of a semiconductor body according to another embodiment of the present invention.

In the embodiment illustrated in FIG. 8, the trench 10 is relatively shallow, and only extends a small proportion of the distance across the drain drift region 4a towards the drain contact region 4b.

In a similar manner to the embodiment of FIG. 3, the gate 8 in the structure of FIG. 8 does not extend into the drain drift region 4a, that is, it is shallower than the upper boundary of the drain drift region adjacent the trench 10. The field plate or lower electrode 24 in the trench below the gate extends into the channel accommodating region 6.

As the field plate or lower electrode 24 shown in FIG. 8 only extends a small fraction of the distance across the drain drift region, its impact on the breakdown properties of the device may be consequently reduced, but it still provides an effective shield for the gate if it is connected to a suitable fixed potential. As in the FIG. 3 embodiment, this bias potential should be greater than the gate threshold voltage to ensure that a channel is induced alongside the field plate or lower electrode in the on-state of the device.

Thus there is provided (as exemplified by FIG. 8) a novel trench-gate semiconductor device including a semiconductor body defining a trench having an insulated gate therein, the semiconductor body comprising a source region and a drain region of a first conductivity type which are separated by a channel-accommodating region adjacent to the gate, the drain region comprising a drain drift region and a drain contact region, with the drain drift region between the channel-accommodating region and the drain contact region, and the drain drift region doped to a lesser extent than the drain contact region, and an insulated lower electrode in the trench between the gate and the drain contact region, wherein the lower electrode is for connection to a bias potential at least equal to the gate potential and lower than the bulk breakdown voltage of the drain drift region, the gate is shallower than the upper boundary of the drain drift region adjacent the trench, and the field plate extends above the upper boundary.

A vertical discrete device has been illustrated with reference to FIGS. 1 to 4, having its drain electrode 22 contacting the region 4b at the back surface 20b of the body 20. However, an integrated device is also possible in accordance with the invention. In this case, the region 4b may be a doped buried layer between a device substrate and the epitaxial low-doped drain region 4a. This buried layer region 4b may be contacted by an electrode at the front major surface 20a, via a doped peripheral contact region which extends from the surface 20a to the depth of the buried layer.

Semiconductor materials other than silicon may be used for devices in accordance with the invention, for example, silicon carbide.

No plan view of the cellular layout geometry for a vertical device is shown in the drawings, because the invention is applicable to quite different, known cell geometries. Thus, for example the cells may have a square geometry, or they may have a close-packed hexagonal geometry or an elongate stripe geometry. In each case, the trench 10 (with its gate 8) extends around the boundary of each cell. FIG. 1 shows only one cell, but typically the device comprises many hundreds of these parallel cells between the electrodes 18 and 22. Similarly, only one cell is shown in FIG. 7 for the purposes of illustration.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

The invention claimed is:

1. A trench-gate semiconductor device including:
   a semiconductor body (20) defining a trench (10) having an insulated gate (8) therein, the semiconductor body comprising a source region (2) and a drain region (4) of a first conductivity type which are separated by a channel-accommodating region (6) adjacent to the gate, the drain region comprising a drain drift region (4a) and a drain contact region (4b), with the drain drift region between the channel-accommodating region (6) and the drain contact region (4b), and the drain drift region (4a) doped to a lesser extent than the drain contact region (4b); and
   an insulated field plate (24) in the trench (10) between the gate (8) and the drain contact region (4b), wherein the field plate (24) is connected in operation to a bias source at a bias potential greater than the gate potential and near to the bulk breakdown voltage of the drain drift region (4a).

2. A device of claim 1 wherein the trench (10) extends substantially to the junction (4c) between the drain drift region (4a) and the drain contact region (4b).

3. A device of claim 1 or 2 wherein the gate (8) is shallower than the upper boundary of the drain drift region (4a) and the drain contact region (4b).

4. A device of claim 1 or claim 2 wherein the doping level of the drain drift region (4a) increases towards the drain contact region (4b).

5. A module (60) comprising a device of claim 1 or claim 2 wherein the field plate (24) is connected to an internal voltage line of the module (60).

6. A device of claim 1 or claim 2 wherein an additional external terminal (54) is provided which is electrically connected to the field plate (24).

7. A module (60) of claim 5 wherein the bias potential is around 60 or 100% of the bulk breakdown voltage of the drain drift region (4a).

8. A module 60 of claim 7 wherein the bias potential is around 80% of the bulk breakdown voltage of the drain drift region (4a).

9. A method of operating a trench-gate semiconductor device of claim 1 or claim 2, comprising applying to the field plate (24) of the device said bias potential greater than the gate potential and near to the bulk breakdown voltage of the drain drift region (4a).

10. A method of claim 9 wherein the bias potential is around 60 to 100% of the bulk breakdown voltage of the drain drift region (4a).

11. A method of claim 10 wherein the bias potential is around 80% of the bulk breakdown voltage of the drain drift region (4a).

* * * * *